United States Patent [19]

Kurth et al.

[11] 4,311,869
[45] Jan. 19, 1982

[54] SOLAR CELL MODULES

[75] Inventors: William T. Kurth, Beverly Farms; William B. Andrulitis, Manchester, both of Mass.

[73] Assignee: Exxon Research & Engineering Co., Florham Park, N.J.

[21] Appl. No.: 97,198

[22] Filed: Nov. 26, 1979

Related U.S. Application Data

[63] Continuation-in-part of Ser. No. 920,693, Jun. 3, 1978.

[51] Int. Cl.³ .......................................... H01L 31/04
[52] U.S. Cl. ............................... 136/246; 136/251
[58] Field of Search ........................... 136/246, 251

[56] References Cited

U.S. PATENT DOCUMENTS 4,116,718  9/1978  Yerkes et al. ................ 136/246
4,162,928  7/1979  Shepard, Jr. ................. 136/246

OTHER PUBLICATIONS

Doe Report, Doe/JPL-954607-78/1, Jan. 5, 1978, pp. 3-10, 3-11, 3-14, 3-15, 6-11, General Electric Space Division, Valley Forge, PA.

Primary Examiner—Aaron Weisstuch
Attorney, Agent, or Firm—Joseph J. Dvorak

[57] ABSTRACT

Solar cell modules having light scattering surfaces at least in the land areas between a plurality of arrayed solar cells and optically coupled to the cells by means of an internally reflective plate having a planar surface of incidence and an opposed textured surface provide increased module output. Insolation impinging on the light scattering surfaces is diffused upwardly through the optical coupling medium and then downwardly toward a solar cell, thereby increasing the output of the module.

5 Claims, 3 Drawing Figures

SOLAR CELL MODULES

CROSS-REFERENCE TO RELATED APPLICATION

This application is a continuation-in-part of U.S. Ser. No. 920,693, filed June 30, 1978.

FIELD OF THE INVENTION

This invention relates to a technique for enhancing the output of solar cell modules. More particularly, the present invention relates to an improved solar cell module designed to utilize light impinging on areas between the cells which would normally not be utilized in photoelectric conversion, thereby increasing the power output of the cell.

BACKGROUND OF THE INVENTION

A solar cell array comprises a plurality of individual cells and interconnector means for electrically connecting adjacent cells in a matrix. Typically, the individual solar cells are arranged in columns and rows and the interconnector means are positioned so as to connect the cells in the requisite series and/or parallel circuit arrangement. This circuit arrangement, of course, depends upon the desired output voltage and current at the module peak power point.

Generally, for terrestrial applications, a solar cell array is fabricated and sold as a module comprising the solar cell array mounted on an electrically nonconductive support member having electric output terminals provided therein. The module also has a top cover over the solar cell array. This cover is a transparent protective coating which protects the solar cells against environmental hazards. Typically the module is fitted into a metal frame which provides mechanical strength for the array and protects the solar cell array against damage due to environmental loadings such as from wind, snow, ice, rain, etc. The metal frame also serves as a means for mounting the module at the proper angle to receive insolation.

The individual solar cells used in forming a solar cell array for terrestrial applications are circular discs or wafers having diameters generally in the range of 2 to 4 inches and formed from a polycrystalline silicon ingot which is melted, and then reformed into a cylindrical ingot of single crystalline silicon. The discs or wafers are then cut from the cylindrical ingot. These circular cells are quite common in commercial use because they are relatively less expensive per unit area than cells having another geometry. When the circular cells are arrayed, however, the total active surface area of the array, i.e., of the solar cells, is less than the area required for mounting the array. Thus, not all the solar radiation which impinges on the module is utilized, since only some of the solar radiation impinges on active solar cell areas and some of the radiation impinges on inactive areas between the circular solar cells.

A number of techniques have been proposed for increasing the efficiency and effectiveness of solar cell modules by focusing incident solar radiation onto active cell areas. For example, mirrors and the like have been proposed to reflect solar radiation and concentrate the radiation in a given area. In this regard, see U.S. Pat. No. 3,990,914, wherein a tubular solar cell is described which is mounted in a parabolic mirror for concentration of solar radiation onto the solar cells. Also, mention should be made of U.S. Pat. No. 2,904,612 describing a reflector-type device in which the land areas between the circular solar cells consist essentially of inverted intersecting frustums of cones circumscribing the cells.

Another technique employed to enhance solar cell module output is the use of lenses. In U.S. Pat. No. 3,018,313, for example, a solar cell module is described which has an array of lenses covering the module so as to concentrate the light impinging on the cover of the solar cell array to converge downwardly toward the active solar cell area. In U.S. Pat. No. 4,053,327, yet another light focusing arrangement is described wherein the cover of a solar cell module comprises a plurality of converging lenses arranged so as to direct the light incident on the module so that it does not fall on the grid lines of the front electrode of the solar cells in the array. Yet another optical system for focusing incident radiation onto the solar cells so as to increase electric output and increase the efficiency of operation of such modules is disclosed in U.S. Pat. No. 4,042,417.

In addition to reflecting solar insolation from inactive areas of solar cell modules to the active areas of solar cells, it has also been proposed to use reflective surfaces below very thin solar cells so that light which penetrates the active solar cell area without being absorbed can be reflected back again to the active layer. See, for example, U.S. Pat. No. 3,973,994.

Finally, mention is made of techniques and devices for redirecting the light incident on inactive areas of solar cell modules which lie between the arrayed circular solar cells so that the unabsorbed radiation is internally reflected back toward a cell by the optical medium covering the array. In this regard, mention is made of U.S. Pat. No. 4,116,718 and particularly copending application Ser. No. 920,693. Indeed, in its broadest aspect, copending application U.S. Ser. No. 920,693 discloses that the electric output of a solar cell module can be enhanced by providing light diffusive surfaces between the cells which are optically coupled to the cells by an optical medium such that light impinging on the light scattering surfaces will be internally reflected toward an active cell area. In one embodiment, the optical medium employed is largely a rigid light transparent material such as a plate of glass. The solar cells of the module are bonded to the bottom surface of the glass, and a diffusive surface is provided between the solar cells.

SUMMARY OF THE INVENTION

Simply stated, the present invention is based on the discovery that the output of a solar cell module employing an internally reflective cover plate and diffusive surfaces between arrayed cells can be enhanced particularly by use of a cover plate having a top planar surface of incidence and bottom textured surface. Thus, an improved solar cell module is provided comprising an internally reflective transparent cover plate characterized by a planar surface of incidence and a uniformly textured bottom surface. At least one silicon solar cell is bonded at its active surface to a portion of the textured surface of the cover plate. In the area around the cell is a diffusive surface, whereby incident solar flux striking the surface of incidence is re-reflected internally of the cover plate until incident upon the active surface of the solar cell. The diffusive surface is bonded to the textured surface of the cover plate by a light transparent adhesive.

DESCRIPTION OF THE PREFERRED EMBODIMENT

Figure 1:
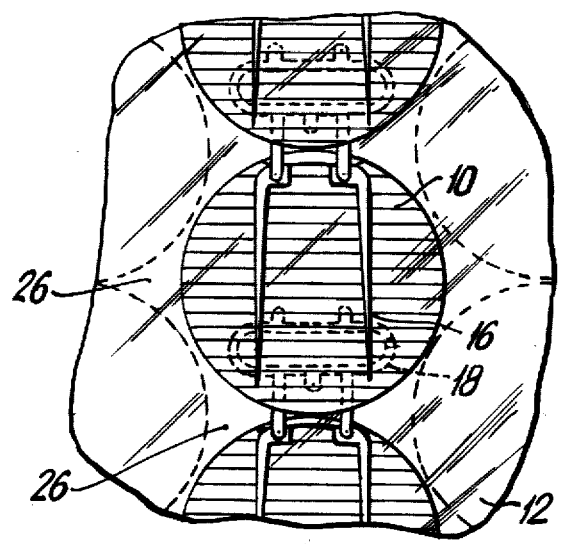
FIG. 1 is a fragmented, top plan view showing solar cells affixed to the bottom textured surface of a transparent cover plate comprising a solar voltaic concentrator embodying the principles of the instant invention.

Referring now to the drawings with more particularity, wherein like reference characters designate like or corresponding parts throughout the several views, there is shown in FIG. 1 a fragment of a solar cell module which embodies the principles of the instant invention.

As shown, the module, not designated, includes a silicon solar cell 10 mounted on a solar flux concentrator 12. The details of the solar cell 10, of course, form no specific part of the instant invention; therefore, an in-depth description of the solar cell 10 is omitted in the interest of brevity. However, it is to be understood that the solar cell 10 comprises a photovoltaic device of well known design. The cell includes an active surface 14, FIG. 2, to which is attached contacts 16, FIG. 1, and a back surface to which is connected contacts 18. The contacts are affixed to the cell 10 in a conventional manner and, of course, serve to connect the cell 10 to adjacent cells provided for the module, all in a manner well understood by those familiar with the design and fabrication of solar cell modules. Hence, it is to be understood the cells 10 are of known design and are interconnected in a known manner for purposes of converting solar flux to electrical energy.

Figure 2:
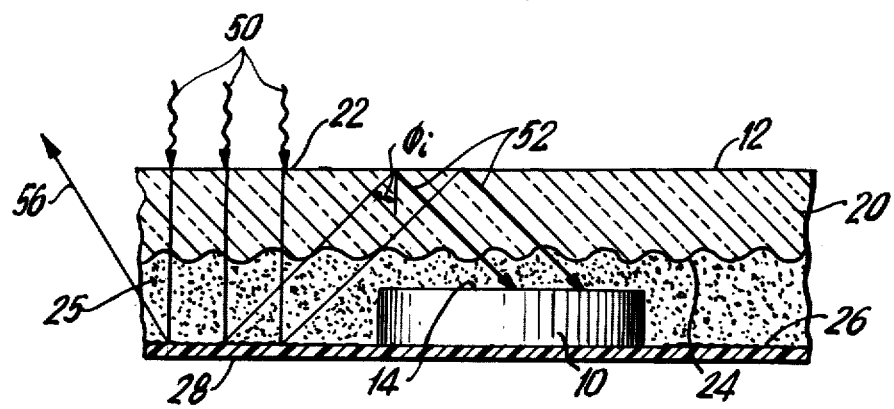
FIG. 2 is a fragmentary diagrammatic side elevation in cross section illustrating one embodiment of the present invention.

Turning again to FIG. 2, it can be seen that the concentrator 12 comprises a plate 20 formed of a highly transparent material. One such material is available as ASG Sunadex glass. The plate 20, as best illustrated in FIG. 2, includes a relatively flat and smooth surface 22, herein referred to as a surface of incidence for solar flux. That is to say, the surface 22 comprises the surface of the concentrator on which solar energy falls and through which solar energy is admitted to the concentrator.

Figure 3:
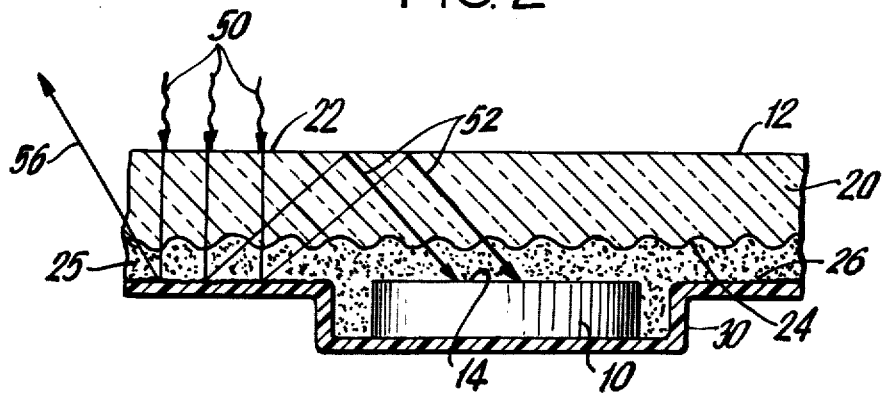
FIG. 3 is a fragmentary diagrammatic side elevation in cross section illustrating another embodiment of the present invention.

The surface of the plate 20, opposite the surface of incidence 22, comprises a textured surface designated 24. The textured surface 24, in practice, is deliberately embossed to provide a regular pattern of uniform indentations. To this surface there is bonded a uniform array of solar cells 10. The cells are bonded to the plate 20 by an optically transparent adhesive 25 such as a layer of a silicone encapsulating material generally known to the electronics and solar cell industry. The thickness of the adhesive layer 25 is a matter of choice but generally will be about 0.01 inches thick. A plurality of light scattering or diffusively reflected surfaces 26 are provided at least in the land areas 12 between the solar cells 10. Preferably the light scattering surface is the top surface of a thin white plastic film such as sheet 28 of FIG. 2 located to be coplanar with the bottom of cell 10. Optionally the film can be thermoformed to have a raised land area substantially coplanar with the top of solar cell 10. Such a thermoformed film 30 is shown in FIG. 3. The optically transparent adhesive 25 also bonds the cells 10 and the light scattering surfaces 26 to the top support structure 12 as well as assures that there is no air space between the solar cells 10 and the top support structure 12 or between the light scattering surfaces and the support 12 which is, of course, the primary optical medium. The entire assembly can be mounted in a metal frame (not shown) for mounting the assembly to receive insolation.

The purpose of the white surface described above is to establish internal reflection of solar energy within the plate 20 for thus causing the rays thereof to strike the surface of incidence 22 at angles of incidence greater than the critical angle therefor, whereby the solar energy is progressively reflected internally of the plate 20 until it is permitted to pass from the plate 20 to strike the active surface 14 of a solar cell 10. The critical angle, of course, refers to the largest value which the angle of incidence may have for a ray of light passing from a more dense medium to a less dense medium. If the angle of incidence ($\phi_i$ in FIG. 2) exceeds the critical angle, the ray of light will not enter the less dense medium but will be totally internally reflected back to the denser medium. Thus as is shown in FIGS. 2 and 3, the solar flux, designated generally as lines 50, which impinges on the land area 26 or nonactive area of the support structure is scattered because of the white light diffusive surface thereof. Some of the light which is scattered at shallow angles (see lines 52) will be trapped by the optical cover surface 12 and redirected so as to fall on the active surface of a solar cell 10, i.e., the light is totally internally reflected. Some of the light, of course, will be reflected from the surface of the land area 26 and will "escape" from the optical cover surface 12 (see line 56, for example).

Finally, it is worth noting that many white surfaces are not truly able to reflect light in a totally diffuse manner, but these surfaces do, in fact, have a "quasi-specular" light reflective component. The term "quasi-specular" light reflective component is used to differentiate between the term "specular" reflection as generally understood in the art of measuring, describing and evaluating the ability of a specimen to reflect light flux. "Specular" reflection indicates that only light that is mirror reflected is included for measurement. In other words, light that is reflected within a very narrow angular range is measured. Typically, metallic mirrors exhibit pure specular reflection and the cone of measurement is less than $\frac{1}{2}°$. In contrast thereto, "diffuse" reflection refers to light that is distributed in all directions without any discontinuities or abrupt increases in reflection at any angle. Diffuse reflection is typically highest normal to the surface and falls monotonically as the viewing angle approaches the horizon.

As indicated, many surfaces such as the white polyester surfaces, the white plastic films and the white painted surfaces have a nearly specular or quasi-specular reflective component of about 10%. Texturizing the white surface, for example, by surface roughing via sand blasting, sanding, etc., tends to reduce the quasi-specular component to less than about 5% and enhance the output of the solar cell module when that texturized surface is employed. Thus, in one embodiment of the present invention, the white diffusive surface 26 preferably has a specular component of less than about 5%.

The general procedure for evaluating the manner in which a specimen material geometrically redistributes light is called goniophotometry; and, the method of making such measurements is set forth in ASTM Test Method E-167-63.

What is claimed is:

1. An improved solar cell module comprising:
   (a) an internally reflective, transparent cover plate having a pair of opposed surfaces including a substantially smooth planar surface of incidence for accepting incident solar energy, and a uniformly textured surface characterized by a plurality of uniformly configured indentations;
   (b) a plurality of silicon solar cells adhesively bonded at the active surfaces thereof to mutually spaced portions of said textured surface and defining therebetween interspaces; and
   (c) a light diffusive reflective layer adhesively bonded to the textured surface of the cover plate by a light transparent adhesive in the interspaces defined between said cells for internally reflecting solar energy to strike said surface of incidence of the cover plate at such angles as to be internally re-reflected, whereby the energy is caused to progress toward the active surfaces of the solar cells.

2. The module of claim 1 wherein the light transparent adhesive is an optically clear silicone resin.

3. The module of claim 2 wherein said diffusively reflective material in the interspaces is substantially coplanar with the bottom surface of said solar cells.

4. The module of claim 2 wherein the diffusively reflective material in the interspaces is substantially coplanar with the top surface of said solar cells.

5. The module of claim 3 or 4 wherein the diffusively reflective material in the interspaces has a light reflective specular component of less than 5% as determined by goniophotometry.

* * * * *